(12) United States Patent
Cai et al.

(10) Patent No.: US 10,134,769 B2
(45) Date of Patent: Nov. 20, 2018

(54) ARRAY SUBSTRATE, METHOD FOR MANUFACTURING THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhenfei Cai, Beijing (CN); Liping Luo, Beijing (CN); Zhaohui Hao, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/432,638

(22) PCT Filed: Aug. 1, 2014

(86) PCT No.: PCT/CN2014/083562
§ 371 (c)(1),
(2) Date: Mar. 31, 2015

(87) PCT Pub. No.: WO2015/043315
PCT Pub. Date: Apr. 2, 2015

(65) Prior Publication Data
US 2016/0035748 A1    Feb. 4, 2016

(30) Foreign Application Priority Data

Sep. 29, 2013 (CN) .......................... 2013 1 0455200

(51) Int. Cl.
*H01L 27/12* (2006.01)
*G02F 1/1345* (2006.01)

(52) U.S. Cl.
CPC ........ *H01L 27/124* (2013.01); *G02F 1/13458* (2013.01); *H01L 27/1259* (2013.01)

(58) Field of Classification Search
CPC .................................................. H01L 27/124
See application file for complete search history.

(56) References Cited

U.S. PATENT DOCUMENTS

| | | |
|---|---|---|
| 5,032,890 A | 7/1991 | Ushiku et al. |
| 2003/0122989 A1 | 7/2003 | Park et al. |

(Continued)

FOREIGN PATENT DOCUMENTS

| | | |
|---|---|---|
| CN | 1237373 C | 1/2006 |
| CN | 101101914 A | 1/2008 |

(Continued)

OTHER PUBLICATIONS

International Search Report dated Oct. 27, 2014; PCT/CN2014/083562.

(Continued)

*Primary Examiner* — Michael Lebentritt
*Assistant Examiner* — Suberr Chi
(74) *Attorney, Agent, or Firm* — Ladas & Parry LLP

(57) ABSTRACT

Disclosed is an array substrate, a method for manufacturing the same, and a display device. The array substrate includes: a base substrate and a plurality of data lines disposed on the base substrate. The base substrate comprises a plurality of attaching areas in which the end of each data line attaches to the base substrate, and non-attaching areas between each two adjacent attaching areas, and a height layer is disposed between a passivation layer and the base substrate in the non-attaching area. By interposing a height layer between the passivation layer and the base substrate in the non-attaching area, the height difference between the passivation layer in the attaching area and the non-attaching area is (Continued)

decreased or disappeared, then the problem of fall-off of the passivation layer is solved, and the reliability of the product is increased.

5 Claims, 3 Drawing Sheets

(56) References Cited

U.S. PATENT DOCUMENTS

| | | | |
|---|---|---|---|
| 2004/0125313 A1* | 7/2004 | Lim | G02F 1/136286 349/152 |
| 2009/0122213 A1* | 5/2009 | Ko | G09G 3/3677 349/46 |
| 2015/0221669 A1* | 8/2015 | Sun | H01L 29/66765 257/72 |

FOREIGN PATENT DOCUMENTS

| | | |
|---|---|---|
| CN | 101697053 A | 4/2010 |
| CN | 103293727 A | 9/2013 |
| CN | 103500746 A | 1/2014 |

OTHER PUBLICATIONS

Written Opinion of the International Searching Authority dated Oct. 27, 2014; PCT/CN2014/083562.
First Chinese Office Acton dated Aug. 13, 2015; Appln. No. 201310455200.1.
Second Chinese Office Action Appln. No. 201310455200.1; dated Mar. 8, 2016.
Third Chinese Office Action dated Jun. 28, 2016; Appln. No. 201310455200.1.

* cited by examiner

ARRAY SUBSTRATE, METHOD FOR MANUFACTURING THEREOF, AND DISPLAY DEVICE

TECHNICAL FIELD

Embodiments of the present invention relate to an array substrate, a method for manufacturing the same, and a display device.

BACKGROUND

A liquid crystal display device mainly comprises a liquid crystal display panel and a driving device which drives the liquid crystal display panel. The liquid crystal display panel mainly comprises a first substrate and a second substrate that disposed oppositely. For example, the first substrate is an array substrate, and the second substrate is a color filter substrate. The array substrate comprises a plurality of data lines and a plurality of scan lines, which intersect each other to define a plurality of pixel regions. A thin film transistor is disposed in each pixel region. The driving device comprises a gate drive circuit which transmits the scan signal to the scan line, and a source drive circuit which transmits the data signal to the data line.

As illustrated in FIG. 1, the end of the data line 1 attaches to an attaching area 2 of the base substrate. In this area, a source drive circuit or the other control circuit is connected with the data line 1. A non-attaching area 3 is formed between two adjacent attaching areas 2. In the attaching area 2 and the non-attaching area 3, a passivation layer 5 is covered on the base substrate, in order to prevent the data line 1 from being oxidized or physically damaged. A via hole 4 is disposed on the passivation layer 5. Through the via hole 4, the source drive circuit or the other control circuit is connected with the data line 1. As illustrated in FIG. 3, in the attaching area 2, a data line 1 and an active layer 8 are disposed between a passivation layer 5 and a gate insulation layer 7, thus the height of the passivation layer in the attaching area 2 is ΔH1 higher than that in the non-attaching area 3.

SUMMARY

In first respect, there is provided an array substrate, which comprises: a base substrate, a plurality of data lines are disposed on the base substrate; wherein the base substrate comprises a plurality of attaching areas where an end of each data line attaches to the base substrate and a non-attaching area disposed between two adjacent attaching areas, a height layer is disposed between a passivation layer and the base substrate in the non-attaching area.

As an example, the array substrate further comprises a gate metal layer disposed on the base substrate, which in the same layer and made from the same material with the height layer.

As an example, an active layer is disposed between the end of the data line and the base substrate. A thickness of the height layer is equal to a sum of the thicknesses of the data line and the active layer.

As an example, a length of the height layer is equal to or larger than a length of the attaching area.

As an example, a thickness of the height layer is set to make the passivation layer flush in the attaching area and non-attaching area.

In second respect, there is provided a method for manufacturing the array substrate, which comprises: providing a base substrate, wherein a plurality of data lines are disposed on the base substrate, the base substrate comprises a plurality of attaching areas where an end of each data line attaches to the base substrate and a non-attaching area disposed between two adjacent attaching areas; and forming a height layer in the non-attaching area of the base substrate.

As an example, the aforementioned method further comprising: forming a gate electrode on the base substrate; and successively forming a gate insulation layer, an active layer, a data line, a source-drain metal layer, a passivation layer and a via hole on the base substrate with the gate electrode formed thereon.

As an example, the gate electrode and the height layer are formed on the base substrate simultaneously.

As an example, the step of forming the gate electrode and the height layer on the base substrate simultaneously comprises: depositing a metal film on the base substrate; forming patterns of the gate electrode and height layer by a pattern process.

As an example, the step of forming patterns of the gate electrode and height layer by a pattern process comprises: coating a layer of photoresist on the metal film; exposing and developing the layer of photoresist with a mask, to form a photoresist-retained region which corresponds to the gate electrode and height layer, and a photoresist-removed region which corresponds to the remaining region other than the photoresist-retained region; removing the metal film in the photoresist-removed region by an etching process; and stripping the residual photoresist.

As an example, the height layer and the gate electrode are made from the same material.

As an example, a thickness of the height layer is a sum of the thicknesses of the data line and the active layer.

In third respect, there is provided a display device, which comprises: an array substrate according to any one of the described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Reference signs: 1: data line; 2: attaching area; 3: non-attaching area; 4: via hole; 5: passivation layer; 6: height layer; 7: gate insulation layer; 8: active layer.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
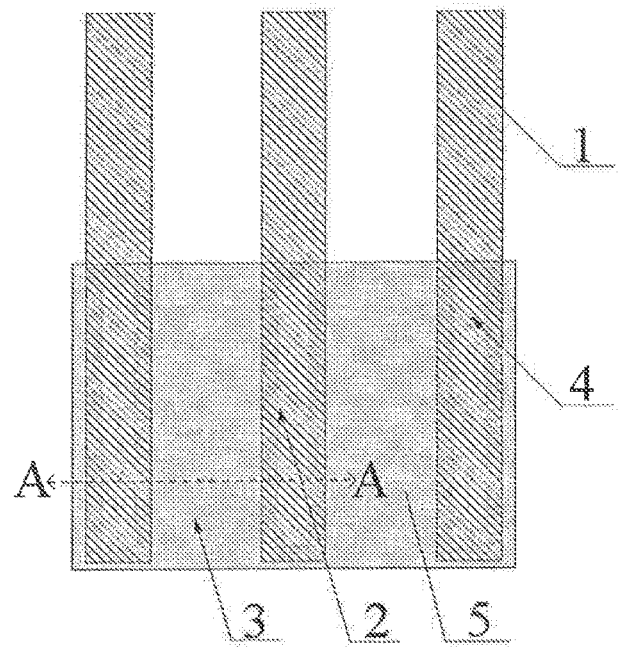
FIG. 1 is a top view of an attaching area and non-attaching area of a known array substrate.
Figure 2:
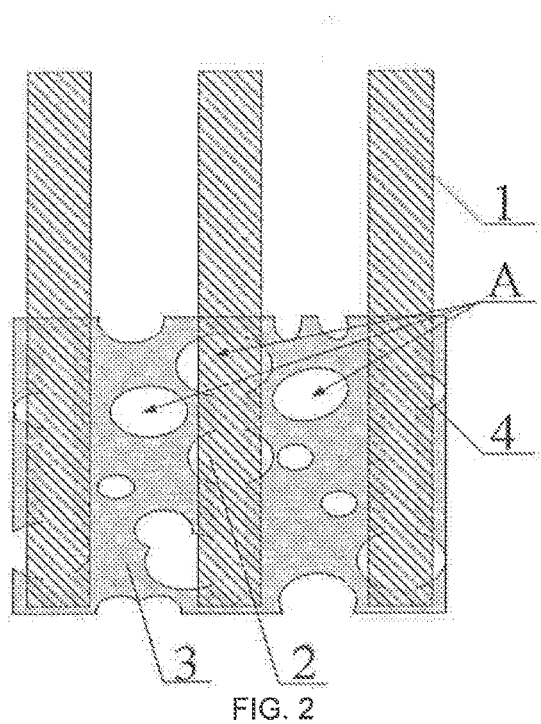
FIG. 2 schematically illustrates a passivation layer falling off the array substrate of FIG. 1.
Figure 3:
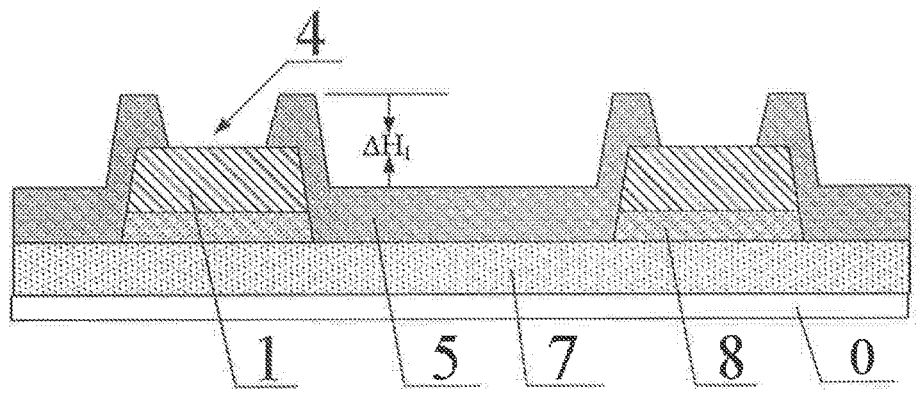
FIG. 3 is a cross-section view taken along A-A direction of FIG. 1.

Because of the presence of ΔH1, as illustrated in FIG. 2, the passivation layer is easy to fall off the array substrate of FIG. 1, such that the exposed data line 1 tends to be oxidized, or undergo physical damage, or corroded by the pollutants, thus a poor connection is induced. So the present invention provides an array substrate which enables to alleviate the fall-off of a passivation layer; Further, the present invention provides a method for manufacturing the array substrate, and a display device comprising the array substrate.

Figure 4:
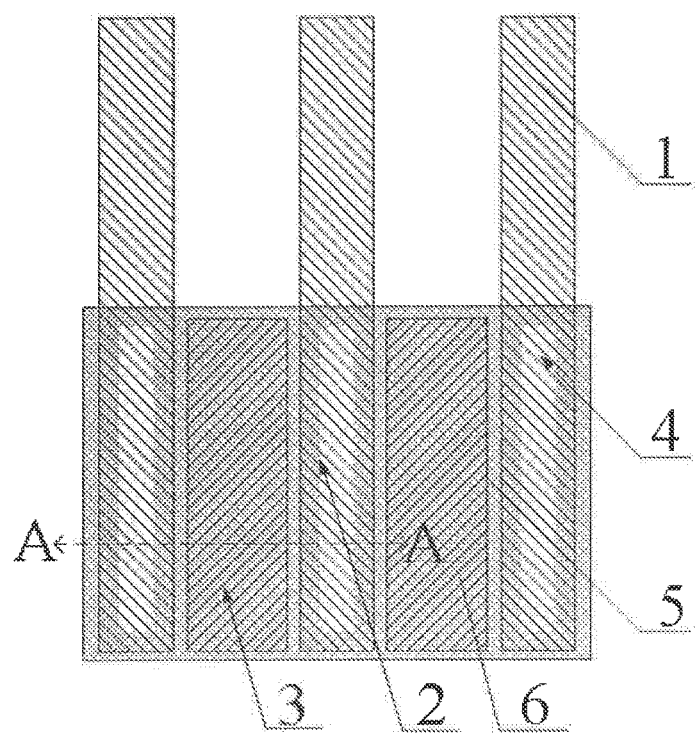
FIG. 4 is a top view of an attaching area and non-attaching area of an array substrate according to an embodiment of the present invention.
Figure 5:
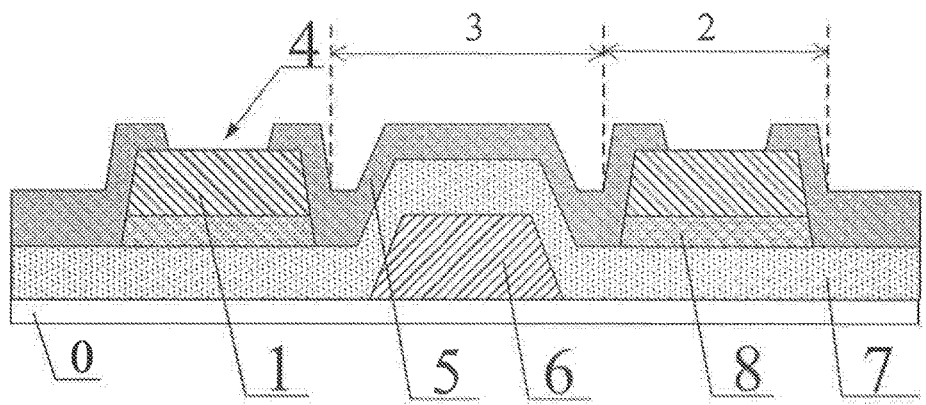
FIG. 5 is a cross-section view taken along A-A direction of FIG. 4.

As illustrated in FIG. 4 and FIG. 5, an array substrate according to an embodiment of the present invention, comprises:

a base substrate (not shown), and a plurality of data lines 1 disposed on the base substrate; where the base substrate comprises a plurality of attaching areas 2 in which the end of each data line 1 attaches to the base substrate, and non-attaching areas 3 between each two adjacent attaching areas 2; the outermost layer in both the attaching areas 2 and non-attaching areas 3 is a passivation layer 5; a height layer 6 is disposed between the passivation layer 5 and the base substrate in the non-attaching area 3.

For the above array substrate, the height difference between the passivation layer in the attaching area 2 and the non-attaching area 3 is decreased or disappeared by interposing the height layer 6 between the passivation layer 5 and the base substrate in the non-attaching area 3, thus, the passivation layer in both the attaching area 2 and the non-attaching area 3 are flattened (i.e., flush with each other), then the problem of fall-off of the passivation layer is solved, the possibility of occurrence of poor connection is reduced, and the reliability of the product is increased.

In the embodiment, because an active layer 8 is disposed between the end of the data line 1 and the base substrate, the thickness of the height layer 6 is for example approximately equal to the sum of the thicknesses of the data line 1 and the active layer 8, and now the passivation layer in both the attaching area 2 and the non-attaching area 3 is nearly flat in same plane.

As an example, the length of the height layer 6 is equal to or larger than the length of the attaching area 2. For example, the length of the height layer 6 is a little larger than the length of the attaching area 2, such that the height difference between the passivation layer in the attaching area 2 and the non-attaching area 3 is decreased or disappeared in a larger area, so as to avoid the fall-off of the passivation layer as far as possible.

An embodiment of the present invention further provides a method for manufacturing the above array substrate, accordingly. Compared with the known technologies, the main difference is that the method of the embodiment further comprises a step of forming any one of the height layer 6 described above.

For example, the above manufacturing method comprises:

providing a base substrate, wherein a plurality of data lines are disposed on the base substrate, the base substrate comprises a plurality of attaching areas where an end of each data line attaches to the base substrate, and non-attaching areas that are formed between each two adjacent attaching areas; and forming a height layer in the non-attaching areas of the base substrate.

The above height layer may be formed individually, for example, a resin layer is formed individually between the passivation layer 5 and the base substrate in the non-attaching area 3, which functions as a height layer 6. Alternatively, the above height layer 6 is formed simultaneously with other layers, for example, the height layer 6 and the gate electrode are disposed in the same layer and made from the same material, in order to form the height layer 6 and the gate electrode simultaneously, thus the process difficulty and production cost are reduced. Taking the simultaneous formation of the height layer 6 and the gate electrode as an example, it will be detailed as follows.

The method for manufacturing the array substrate according to an embodiment of the present invention comprises the following steps:

a gate electrode (not shown) and a height layer 6 are formed simultaneously on a base substrate; and a gate insulation layer 7, an active layer 8, a data line 1, a source-drain metal layer (not shown), a passivation layer 5 and a via hole 4 are formed successively.

For example, the step of forming simultaneously the gate electrode and the height layer on the base substrate comprises:

101) cleansing the base substrate, wherein the base substrate may be glass substrate, quartz substrate, or the like;

102) depositing a metal film is on the base substrate; for example, a metal film is deposited on the base substrate by magnetron sputtering or thermal evaporation; the metal film may be made from metals or their alloys, such as Cr, W, Ti, Ta, Mo, Al, Cu, etc., and also may be a composite film composed of multi-layer metal film;

103) coating a layer of photoresist on the metal film;

104) exposing and developing the layer of photoresist with a mask, to form a photoresist-retained region which corresponds to the gate electrode and height layer and a photoresist-removed region which corresponds to the remaining area other than the photoresist-retained region;

105) removing the metal film in the photoresist-removed region by etching process;

106) stripping the residual photoresist, the remained metal film comprises a pattern including a gate electrode (and a data line) and a height layer 6.

For example, the step of forming successively a gate insulation layer 7, an active layer 8, a data line 1, a source-drain metal layer, a passivation layer 5 and a via hole 4 comprises:

201) forming a gate insulation layer 7 on the gate electrode and the height layer 6, the gate insulation layer overlays the whole substrate;

202) successively depositing a semiconductor layer and an impure semiconductor layer on the gate insulation layer 7 by PECVD (Plasma Enhanced Chemical Vapor Deposition); and then, depositing a source-drain metal layer by magnetron sputtering or thermal evaporation;

203) coating a layer of photoresist on the source-drain metal layer;

204) exposing and developing the layer of photoresist with a double-tone mask, to form a photoresist-completely-retained region which corresponds to the source electrode and the drain electrode, a photoresist-partly-retained region which corresponds to a trench, and a photoresist-completely-removed region which corresponds to the remaining area other than the above regions;

205) removing the source-drain metal layer, the impure semiconductor layer and the semiconductor layer in the photoresist-completely-removed region by a first etching process, to form a pattern of the active layer 8;

206) removing the photoresist in the photoresist-partly-retained region by ashing process, to expose the source-drain metal layer in this region;

207) removing the source-drain metal layer, the impure semiconductor layer and a part of semiconductor layer in the photoresist-partly-retained region by a second etching process, to form the source electrode, the drain electrode and the trench;

208) stripping the residual photoresist;

209) forming the passivation layer 5 on the source electrode, the drain electrode and the trench by PECVD or other methods;

2010) the via hole 4 is formed by patterning process.

The above method for manufacturing an array substrate according to the embodiment of the present invention is only one of the methods of manufacturing an array substrate provided in the present invention. In practice, the above specific preparation procedure can be changed by increasing or decreasing the number of the patterning process, or choosing different materials.

For the above method for manufacturing an array substrate, the height difference between the passivation layer 5 in the attaching area 2 and the non-attaching area 3 is decreased or disappeared by interposing the height layer 6 between the passivation layer 5 and the base substrate in the non-attaching area 3, thus, the passivation layer in both the attaching area 2 and the non-attaching area 3 are flattened (i.e., flush with each other), then the problem of fall-off of the passivation layer is solved, the possibility of the occurrence of poor connection is reduced, and the reliability of the product is increased.

An Embodiment of the present invention further provides a display device, which comprises an array substrate according to any one of the described above. The display device is any product or component being able to display, such as liquid crystal display (LCD) panel, electronic paper, OLED (Organic Light Emitting Diode) panel, LCD TV, liquid crystal display device, digital photo frame, mobile phone, tablet PC, etc.

For the above display device, because the passivation layer in both the attaching area 2 and the non-attaching area 3 are flattened, the fall-off of the passivation layer is prevented, the possibility of the occurrence of poor connection is reduced, and the reliability of the product is increased.

The present application claims priority from Chinese Application Serial Number 201310455200.1 filed on Sep. 29, 2013, the disclosure of which is hereby incorporated by reference herein in its entirety.

What is described above is related to the illustrative embodiments of the disclosure only and not limitative to the scope of the disclosure; the scopes of the disclosure are defined by the accompanying claims.

The invention claimed is:

1. An array substrate, comprising:
   a base substrate, a gate insulation layer; and
   a plurality of data lines disposed on the base substrate;
   wherein the base substrate comprises a plurality of attaching areas where an end of each data line indirectly attaches to the base substrate, and a non-attaching area disposed between two adjacent attaching areas, a height layer is disposed between a passivation layer and the base substrate in the non-attaching area;
   the height layer is in direct contact with the base substrate, the gate insulation layer is directly connected with the base substrate and directly connected with the height layer, the gate insulation layer and the base substrate completely surround the height layer;
   an active layer is disposed between the end of the data line and the base substrate; a thickness of the height layer is equal to a sum of the thicknesses of the data line and the active layer;
   a thickness of the height layer is set to make an upper surface of the passivation layer in the attaching area and an upper surface of the passivation layer in the non-attaching area being in a same flat surface that is parallel to the substrate.

2. The array substrate according to claim 1, wherein a length of the height layer is equal to or larger than a length of the attaching area.

3. A display device, comprising: an array substrate according to claim 1.

4. A method for manufacturing an array substrate, comprising:
   providing a base substrate, wherein a plurality of data lines are disposed on the base substrate, the base substrate comprises a plurality of attaching areas where an end of each data line indirectly attaches to the base substrate, and a non-attaching area disposed between two adjacent attaching areas; and
   forming a height layer in the non-attaching area of the base substrate; forming a gate insulation layer, wherein the height layer is in direct contact with the base substrate, the gate insulation layer is directly connected with the base substrate and directly connected with the height layer, the gate insulation layer and the base substrate completely surround the height layer;
   an active layer is disposed between the end of the data line and the base substrate; a thickness of the height layer is equal to a sum of the thicknesses of the data line and the active layer;
   a thickness of the height layer is set to make an upper surface of the passivation layer in the attaching area and an upper surface of the passivation layer in the non-attaching area being in a same flat surface that is parallel to the substrate.

5. The method for manufacturing the array substrate according to claim 4, further comprising:
   forming a gate electrode on the base substrate;
   successively forming a gate insulation layer, an active layer, a data line, a source-drain metal layer, a passivation layer and a via hole on the base substrate with the gate electrode formed thereon.

* * * * *